(12) United States Patent
He et al.

(10) Patent No.: US 9,909,061 B1
(45) Date of Patent: Mar. 6, 2018

(54) NITROXIDE FLUORESCENT POWDER AND METHOD FOR PREPARING SAME, NITROXIDE ILLUMINANT, AND LUMINESCENT DEVICE

(71) Applicant: JIANGSU BREE OPTRONICS CO., LTD, Jiangsu (CN)

(72) Inventors: Jinhua He, Jiangsu (CN); Yibing Fu, Jiangsu (CN); Chao Liang, Jiangsu (CN); Xiaoming Teng, Jiangsu (CN)

(73) Assignee: Jiangsu Bree Optronics Co., Ltd, Jiangsu (CN)

( * ) Notice: Subject to any disclaimer, the term of this patent is extended or adjusted under 35 U.S.C. 154(b) by 43 days.

(21) Appl. No.: 15/124,921

(22) PCT Filed: Mar. 4, 2016

(86) PCT No.: PCT/CN2016/075580
§ 371 (c)(1),
(2) Date: Sep. 9, 2016

(87) PCT Pub. No.: WO2017/128492
PCT Pub. Date: Aug. 3, 2017

(30) Foreign Application Priority Data

Jan. 29, 2016 (CN) .......................... 2016 1 0067478

(51) Int. Cl.
*H01L 33/00* (2010.01)
*C09K 11/77* (2006.01)
(Continued)

(52) U.S. Cl.
CPC ...... *C09K 11/7792* (2013.01); *C09K 11/0883* (2013.01); *C09K 11/7734* (2013.01); *C09K 11/7735* (2013.01); *H01L 33/502* (2013.01)

(58) Field of Classification Search
None
See application file for complete search history.

(56) References Cited

U.S. PATENT DOCUMENTS

2006/0001352 A1* 1/2006 Maruta ............. C09K 11/0883
                                                      313/486
2007/0278935 A1* 12/2007 Harada ............. C09K 11/0883
                                                      313/503
(Continued)

FOREIGN PATENT DOCUMENTS

CN          1918262 A      2/2007
CN        103320130 A      9/2013
(Continued)

OTHER PUBLICATIONS

PCT/CN2016/075580 International Search Report and Written Opinion of State Intellectual Property Office of the P.R.C. dated Oct. 28, 2016, 6 pp.
(Continued)

*Primary Examiner* — Shaun Campbell
(74) *Attorney, Agent, or Firm* — Edwin S. Flores; Daniel J. Chalker; Chalker Flores, LLP

(57) ABSTRACT

The present invention discloses a nitroxide fluorescent powder comprising an inorganic compound containing M, A, B, O, N, and R elements; in which the M element is at least one of Ca, Sr, Ba, Mg, Li, Na, and K, the A element is at least one of B, Al, Ga, and In, the B element is at least one of C, Si, Ge, and Sn, the R element is at least one of Ce, Eu, Lu, Dy, Gd, and Ho, characterized in that the inorganic compound forms a crystal in a crystalline phase, and the oxygen atom content in the crystal in a crystalline phase is in an increasing structural distribution from a core to surface of the crystal. The nitroxide fluorescent powder and the nitroxide illuminant of the present invention have the advantages of good chemical stability, good aging and light decay resistance, and high luminescent efficiency, and are useful for various luminescent devices. The preparation method of the present invention is easy and reliable and useful for industrial mass production.

17 Claims, 5 Drawing Sheets

(51) Int. Cl.
*H01L 33/50* (2010.01)
*C09K 11/08* (2006.01)

(56) References Cited

U.S. PATENT DOCUMENTS

2010/0001631 A1* 1/2010 Gotoh .................. C09K 11/0883
  313/503
2010/0289045 A1* 11/2010 Collins ................ C09K 11/025
  257/98
2017/0130126 A1* 5/2017 Wakui ................ C09K 11/0883

FOREIGN PATENT DOCUMENTS

EP        1609839 A2    12/2005
WO     2017128492 A1     3/2017

OTHER PUBLICATIONS

English translation of International Search Report and Written Opinion of State Intellectual Property Office of the P.R.C. dated Oct. 28, 2016, 10 pp.
English Abstract of EP1069839(A2), 2 pp.
English Abstract of CN1918262(A), 2 pp.
English Abstract of CN103320130(A), 1 pg.

* cited by examiner

NITROXIDE FLUORESCENT POWDER AND METHOD FOR PREPARING SAME, NITROXIDE ILLUMINANT, AND LUMINESCENT DEVICE

CROSS-REFERENCE TO RELATED APPLICATIONS

This application is the National Stage of International Application No. PCT/CN2016/075580, filed on Mar. 4, 2016 claiming the priority of CN 201610067478.5 filed on Jan. 29, 2016, the content of each of which is incorporated by reference herein.

BACKGROUND OF THE INVENTION

Field of the Invention

The present invention relates to LED fluorophors and luminescent devices, and more particularly to a nitroxide fluorescent powder capable of being effectively excited with UV light, violet light, or blue light and method for preparing a same, a nitroxide illuminant, and a luminescent device.

Description of Related Art

Nowadays, the semi-conductor lighting electric light source represented by light emitting diodes (LEDs) is touted as the fourth-generation lighting electric light source following incandescent lamps, fluorescent lamps, and energy-saving lamps, and is known as "the green light source in the 21st century".

As semi-conductor lighting is used in the field of general lighting, it is pressing to accelerate the development of white LEDs of high color rendering, anti-aging, and low light decay. Current methods of manufacturing a white LED mainly include the following. 1. Application of a yellow fluorescent powder (YAG) on a blue LED chip to effect emission of white light; however, the YAG fluorescent powder has the disadvantages of relatively high color temperature and relatively low color rendering index, which cannot meet the requirements of semi-conductor lighting; although the emission spectrum of the YAG fluorescent powder is very wide, the emission intensity in a red region is very weak, which results in the lack of red light after mixing with the blue LED chip, thereby affecting related color temperature and color rendering index of the white LED. 2. Application of green and red fluorescent powders on a blue LED chip to solve the problem above; however, the red fluorescent powder also has numerous problems such as large light decay and poor chemical stability of $CaS:Eu^{2+}$, narrow excitation range of $CaMoO_4:Eu^{2+}$, weak absorption and low energy conversion efficiency in a blue region of $Y_2O_3:Eu^{3+}$ and $Y_2O_2S:Eu^{3+}$, and poor light decay resistance of $M_2Si_5N_8:Eu^{2+}$, which all cannot be ideally matched to the LED chip, thus restricting the development of the white LED technology. 3. Introduction of a nitride fluorescent powder of $CaAlSiN_3$ crystal structure; although the overall performance is superior to the above-mentioned YAG fluorescent powder and common red fluorescent powder, the nitride fluorescent powder has significant drawbacks in that: (1) because diffusion of components, nucleation, and preferential growth orientation as well as primary crystallite size in the fluorescent powder synthesis process have not been fully understood, resulting in relatively low luminescent efficiency of the fluorescent powder, the luminescent efficiency needs to be further improved; and (2) because the fluorescent powder may degrade under a combined action of three factors, high optical density, high temperature, and high moisture, directly resulting in decreased overall light effect, and particularly substantial drifting in color coordinates, the durability of the fluorescent powder still cannot fully meet the requirements of common lighting.

A fluorophor is disclosed in CN patent 200480040967.7, comprising an inorganic compound having the same crystal structure as $CaAlSiN_3$. This solution uses a fluorophor with a nitrogen- and oxygen-containing inorganic compound as a matrix, and it is particularly emphasized that because the luminance brightness decreases with the increase of oxygen added, a small amount of oxygen added is preferred, and that in order to obtain good high-temperature durability, the atom numbers of O and N contained in the inorganic compound should meet $0.5 \leq N/(N+O) \leq 1$ (see paragraphs 161 and 271 therein). An obvious disadvantage of this solution is that the range of oxygen content is limited in order to maintain the luminance brightness of the fluorescent powder, so that the durability of the fluorophor is reduced.

The preparation of $(Sr,Ca)AlSiN_3$ red fluorescent powder using alloy process is proposed in "Synthetic method and luminescence properties of $Sr_xCa_{1-x}AlSiN_3:Eu^{2+}+$ mixed nitride fluorescent powders" published in J. Electrochem. Soc., 2008. Compared to fluorescent powder synthesis using a nitride as a starting material, this method results in lower oxygen content, such that the preparation of $(Sr,Ca)AlSiN_3$ red fluorescent powder using alloy process has better consistency and phase purity as well as good stability. However, this method still has a significant drawback in that: because it is highlighted for the $(Sr,Ca)AlSiN_3$ red fluorescent powder prepared by the alloy process to control low oxygen content in order to achieve high consistency and phase purity, the fluorescent powder has significantly reduced durability and thus poor utility, thus limiting its application.

In "Reduced thermal degradation of the red-emitting $Sr_2Si_5N_8:Eu^{2+}$ fluorescent powder via thermal treatment in nitrogen" published in Journal of Materials Chemistry C, 2015, the mechanism of thermal degradation of $Sr_2Si_5N_8:Eu^{2+}$ is discussed. It is thought that by forming a layer of protective oxide film on a surface of the fluorescent powder through calcination, the oxidation of $Eu^{2+}$ is prevented and the thermal degradation is improved, and thus it is assumed that the applicability of $Sr_2Si_5N_8:Eu^{2+}$ in LEDs can be improved, which, however, is not supported by any experimental data. Thus, the long-term aging problem of $Sr_2Si_5N_8:Eu^{2+}$ is not fundamentally solved. In fact, in this system, due to poor stability of $Sr_2Si_5N_8:Eu^{2+}$ itself, the crystal structure on the surface is destroyed during the calcination, so that the fluorescent powder has significantly decreased luminescent intensity, and thus has no practical application value.

Taken together, in the prior art, there is a trade-off between the aging and light decay resistance of the nitride red fluorescent powder and the luminescent efficiency of the fluorescent powder. That is to say, generally, the aging and light decay resistance of the fluorescent powder is improved at the expense of the luminescent efficiency of the fluorescent powder, or the luminescent efficiency of the fluorescent powder is improved at the expense of the aging and light decay resistance of the fluorescent powder. At present, there is no comprehensive solution that realizes the improvement of the aging and light decay resistance of the fluorescent powder without reducing the luminescent efficiency of the fluorescent powder. Thus, how to overcome the shortcomings in the prior art has become a major problem to be solved in the technical field of LED fluorophors and luminescent devices currently.

SUMMARY OF THE INVENTION

An object of the present invention is to provide a nitroxide fluorescent powder and method for preparing a same, a nitroxide illuminant, and a luminescent device, in order to the shortcomings in the prior art. The nitroxide fluorescent powder and the nitroxide illuminant of the present invention have the advantages of good chemical stability, good aging and light decay resistance, and high luminescent efficiency, and are useful for various luminescent devices. The preparation method of the present invention is easy and reliable and useful for industrial mass production.

A nitroxide fluorescent powder according to the present invention comprises an inorganic compound containing M, A, B, O, N, and R elements; in which the M element is at least one of Ca, Sr, Ba, Mg, Li, Na, and K, the A element is at least one of B, Al, Ga, and In, the B element is at least one of C, Si, Ge, and Sn, the R element is at least one of Ce, Eu, Lu, Dy, Gd, and Ho, characterized in that the inorganic compound forms a crystal in a crystalline phase, and the oxygen atom content in the crystal in a crystalline phase is in an increasing structural distribution from a core to surface of the crystal; the increasing structural distribution means that an inner core zone, a transition zone, and a crystal surface layer zone of the crystal in a crystalline phase are respectively formed depending on the distribution of the oxygen atom content in the crystal in a crystalline phase; the oxygen atom content in the inner core zone is in a gently increasing structural distribution from inside to outside, namely, the oxygen atom content in an outer surface of the inner core zone/the oxygen atom content in a core of the inner core zone ≤1.5; the oxygen atom content in the transition zone is in a dramatically increasing structural distribution from inside to outside, namely, the oxygen atom content in an outer surface of the transition zone/the oxygen atom content in an inner surface of the transition zone >1.5; the oxygen atom content in the surface layer zone is in a gently increasing structural distribution from inside to outside, namely, the oxygen atom content in an outer surface of the surface layer zone/the oxygen atom content in an inner surface of the surface layer zone ≤1.5.

A nitroxide illuminant according to the present invention is characterized by comprising a mixture of the nitroxide fluorescent powder as described above and other crystalline grains or non-crystalline particles, the nitroxide fluorescent powder being present in the mixture at a proportion of no less than 50 wt %.

A method 1 for preparing a nitroxide fluorescent powder according to the present invention is characterized by comprising the following basic steps:

step 1: weighting desired starting materials at a stoichiometric ratio of cations in the composition of a chemical formula $M_{m-r}A_aB_bO_cN_n:R_r$ with a nitride of M, a nitride of A, a nitride of B, and a nitride or oxide of R as starting materials, and uniformly mixing to form a mix;

step 2: subjecting the mix obtained in the step 1 to high-temperature calcination in a calcination atmosphere, followed by low-temperature calcination at a reduced predetermined temperature in a nitrogen-oxygen mixture or air atmosphere, to give a nitroxide fluorescent powder semi-product; and step 3: subjecting the nitroxide fluorescent powder semi-product obtained in the step 2 to a post-treatment, to give a nitroxide fluorescent powder product.

A method 2 for preparing a nitroxide fluorescent powder according to the present invention is characterized by comprising the following basic steps:

step 1: weighting desired starting materials at a stoichiometric ratio of cations in the composition of a chemical formula $M_{m-r}A_aB_bO_cN_n:R_r$ with a nitride of M, a nitride of A, a nitride of B, and a nitride or oxide of R as starting materials, and uniformly mixing to form a mix;

step 2: subjecting the mix obtained in the step 1 to high-temperature calcination in a calcination atmosphere, to give a nitroxide fluorescent powder semi-product;

step 3: subjecting the nitroxide fluorescent powder semi-product obtained in the step 2 to a post-treatment; and step 4: subjecting the nitroxide fluorescent powder semi-product obtained in the step 3 to low-temperature calcination, to give a nitroxide fluorescent powder product.

A luminescent device according to the present invention is characterized by at least comprising an LED chip emitting UV light, violet light or blue light, and a fluorescent powder, wherein the fluorescent powder at least uses the nitroxide fluorescent powder as described above.

The present invention is achieved based on the principles that: through the structural design of the nitroxide fluorescent powder as described above, the structure of the nitroxide fluorescent powder is divided into the surface layer zone, the transition zone, and the inner core zone, and these zones are integrally chemically bonded together. Maintaining the original atom composition of the mix in the inner core zone forms a nitroxide crystal or solid solution, thereby ensuring highly efficient luminescence; because more defects may be easily formed in the crystal surface during the synthesis process of the nitroxide crystal, and particularly, in a section near the crystal surface, the number of defects is significantly increased with the decrease of the distance to the surface, in the present invention, the transition zone and the surface layer zone are sequentially formed in the outer surface of the inner core zone through chemical reactions for introducing oxygen at a low temperature, such that the oxygen atom content in the crystal in a crystalline phase is in an increasing structural distribution from a core to surface of the crystal, and particularly, where the oxygen atom content in the transition zone is in a dramatically increasing structural distribution from inside to outside and the oxygen atom content in the surface layer zone is in a gently increasing structural distribution from inside to outside, the negative effect on the highly efficient luminescence formed in the outer layer of the core can be effectively reduced, thereby ensuring significant improvement of luminescent efficiency of the whole particle; also, introducing oxygen at a low temperature in the outer surface of the inner core zone avoids the activator ion on the crystal surface from being oxidized, thereby ensuring the luminescent efficiency of the whole particle; compared to nitrogen ion, oxygen ion has a smaller radius, higher electro-negativity, and stronger interionic binding force, and with the increase of oxygen atom content from the core to the surface of the crystal in the crystal in a crystalline phase of the formed nitroxide fluorescent powder, chemical and thermal stabilities of the transition zone and the surface layer zone in the whole particle can be gradually increased, so as to provide effective protection and shielding effect on the inner core zone of the particle, thereby effectively improving thermal stability and durability of the fluorescent powder in the LED application environment.

Compared with the prior art, the present invention has the following significant advantages.

1. Good chemical stability. In the present invention, a suitable amount of oxygen is introduced in the nitroxide fluorescent powder particle to form the transition zone and the surface layer zone that are more stable, making the crystalline inner core zone more compact and stable.

2. Good aging and light decay resistance. In the present invention, the structure of the nitroxide particle is divided into the inner core zone, the transition zone, and the surface layer zone, and the oxygen atom content is increasing from the core to the surface of the crystal in the crystal in a crystalline phase of the nitroxide fluorescent powder, such that oxygen ion having a smaller radius than that of nitrogen ion can be substituted for more nitrogen ions, so as to enhance the interionic binding force in the crystal in a crystalline phase of the fluorescent powder, thereby imparting the fluorescent powder with very excellent aging and light decay resistance and thus high-temperature durability. In addition, because of the barrier protection effect from the transition zone and the surface layer zone, the inner core zone of the nitroxide fluorescent powder particle is less susceptible to the external adverse environment, such that stability of the luminescent center of the nitroxide fluorescent powder is significantly improved.

3. High luminescent efficiency. In the present invention, maintaining the original atom composition of the mix in the inner core zone forms a nitroxide crystal in a crystalline phase or a solid solution thereof, thereby ensuring highly efficient luminescence; the transition zone and the surface layer zone are sequentially formed in the outer surface of the inner core zone through chemical reactions for introducing oxygen at a low temperature, such that the oxygen atom content in the crystal in a crystalline phase is in an increasing structural distribution from a core to surface of the crystal, and particularly, where the oxygen atom content in the transition zone is in a dramatically increasing structural distribution from inside to outside and the oxygen atom content in the surface layer zone is in a gently increasing structural distribution from inside to outside, the negative effect on the highly efficient luminescence formed in the outer layer of the core can be effectively reduced, thereby ensuring significant improvement of luminescent efficiency of the whole particle; also, introducing oxygen at a low temperature in the outer surface of the inner core zone avoids the activator ion on the crystal surface from being oxidized, thereby ensuring the luminescent efficiency of the whole particle.

4. Wide applicability. The nitroxide fluorescent powder of the present invention is useful for manufacturing various luminescent devices.

5. Ease and reliability of the manufacturing method. The manufacturing method of the present invention is simple and easy to implement and useful for industrial mass production.

DETAILED DESCRIPTION OF THE INVENTION

A detailed description of the present invention will be further given below in detail with reference to the accompanying drawings and embodiments.

Figure 1:
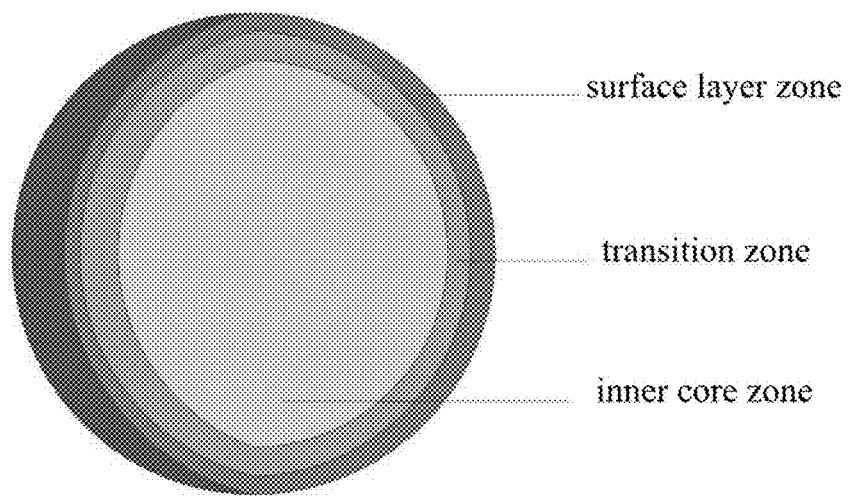
FIG. 1 is a cross-sectional schematic view of a single crystal of a nitroxide fluorescent powder according to the present invention.

Referring to FIG. 1, a nitroxide fluorescent powder of the present invention is shown. The nitroxide fluorescent powder comprises an inorganic compound containing M, A, B, O, N, and R elements; in which the M element is at least one of Ca, Sr, Ba, Mg, Li, Na, and K, the A element is at least one of B, Al, Ga, and In, the B element is at least one of C, Si, Ge, and Sn, the R element is at least one of Ce, Eu, Lu, Dy, Gd, and Ho. The inorganic compound forms a crystal in a crystalline phase, and the oxygen atom content in the crystal in a crystalline phase is in an increasing structural distribution from a core to surface of the crystal.

Further preferred embodiments of a nitroxide fluorescent powder of the present invention include the following.

The increasing structural distribution means that an inner core zone, a transition zone, and a crystal surface layer zone of the crystal in a crystalline phase are respectively formed depending on the distribution of the oxygen atom content in the crystal in a crystalline phase; the oxygen atom content in the inner core zone is in a gently increasing structural distribution from inside to outside, namely, the oxygen atom content in an outer surface of the inner core zone/the oxygen atom content in a core of the inner core zone $\leq 1.5$; the oxygen atom content in the transition zone is in a dramatically increasing structural distribution from inside to outside, namely, the oxygen atom content in an outer surface of the transition zone/the oxygen atom content in an inner surface of the transition zone $>1.5$; the oxygen atom content in the surface layer zone is in a gently increasing structural distribution from inside to outside, namely, the oxygen atom content in an outer surface of the surface layer zone/the oxygen atom content in an inner surface of the surface layer zone $\leq 1.5$.

The oxygen atom content in an outer surface of the transition zone/the oxygen atom content in an inner surface of the transition zone is $>5$.

In the crystal in a crystalline phase, the surface layer zone has a thickness of no more than 100 nm, the transition zone has a thickness of no more than 200 nm, and the inner core zone has a thickness from the inner surface of the transition zone to the core of the inner core zone.

The oxygen atom content in the core of the inner core zone is $\leq 10\%$; the oxygen atom content in the outer surface of the surface layer zone is 30%-50%.

The crystal in a crystalline phase formed by the inorganic compound has a chemical formula of $M_{m-r}A_aB_bN_nO_c:R_r$, in which $0.9 \leq m \leq 1.1$, $0.8 \leq a \leq 1.2$, $0.8 \leq b \leq 1.2$, $2.5 < n \leq 3.5$, $0.001 \leq c \leq 1$, $0.001 \leq r \leq 0.1$, and $2m+3a+4b-3n-2c=0$ is met.

In the inorganic compound, M is one or a combination of Sr and Ca, A is Al, B is Si, and R is Eu.

The inorganic compound has the same crystal structure as the crystalline phase of $CaAlSiN_3$.

Any of the nitroxide fluorescent powders of the present invention as described above is excited at an excitation wavelength ranging from 300-500 nm to emit red light having a peak wavelength at 600-670 nm.

A method 1 for preparing a nitroxide fluorescent powder and preferred embodiments thereof according to the present invention comprises the following basic steps:

step 1: weighting desired starting materials at a stoichiometric ratio of cations in the composition of a chemical formula $M_{m-r}A_aB_bO_cN_n:R_r$ with a nitride of M, a nitride of A, a nitride of B, and a nitride or oxide of R as starting materials, and uniformly mixing to form a mix;

step 2: subjecting the mix obtained in the step 1 to high-temperature calcination in a calcination atmosphere, followed by low-temperature calcination at a reduced predetermined temperature in a nitrogen-oxygen mixture or air atmosphere, to give a nitroxide fluorescent powder semi-product; wherein the high-temperature calcination has a temperature of 1600-2000° C. and a duration of 2-20 h, and the atmosphere of the high-temperature calcination is a pure nitrogen atmosphere or a reducing gas atmosphere; the low-temperature calcination has a temperature of 200-450° C. and a duration of 0.5-24 h, and the volume percent of oxygen in the nitrogen-oxygen mixture atmosphere is no more than 20%; and step 3: subjecting the nitroxide fluorescent powder semi-product obtained in the step 2 to a post-treatment, to give a nitroxide fluorescent powder product; wherein the post-treatment includes primary grinding, screening, washing, drying, secondary grinding, and screening, and the washing is performed to obtain the nitroxide fluorescent powder product having a conductivity of less than 10 μs/cm.

A method 2 for preparing a nitroxide fluorescent powder and preferred embodiments thereof according to the present invention comprises the following basic steps:

step 1: weighting desired starting materials at a stoichiometric ratio of cations in the composition of a chemical formula $M_{m-r}A_aB_bO_cN_n:R_r$ with a nitride of M, a nitride of A, a nitride of B, and a nitride or oxide of R as starting materials, and uniformly mixing to form a mix;

step 2: subjecting the mix obtained in the step 1 to high-temperature calcination in a calcination atmosphere, to give a nitroxide fluorescent powder semi-product; wherein the high-temperature calcination has a temperature of 1600-2000° C. and a duration of 2-20 h, and the atmosphere of the high-temperature calcination is a pure nitrogen atmosphere or a reducing gas atmosphere;

step 3: subjecting the nitroxide fluorescent powder semi-product obtained in the step 2 to a post-treatment; wherein the post-treatment includes primary grinding, screening, washing, drying, secondary grinding, and screening, and the washing is performed to obtain the nitroxide fluorescent powder having a conductivity of less than 10 μs/cm; and step 4: subjecting the nitroxide fluorescent powder semi-product obtained in the step 3 to low-temperature calcination, to give a nitroxide fluorescent powder product; wherein the low-temperature calcination has a temperature of 200-450° C. and a duration of 0.5-24 h, and the atmosphere of the low-temperature calcination is an air atmosphere.

A luminescent device according to the present invention at least comprises an LED chip emitting UV light, violet light or blue light, and a fluorescent powder, wherein the fluorescent powder at least uses any of the nitroxide fluorescent powders of the present invention as described above.

Further preferably, a luminescent device according to the present invention further comprises other types of fluorescent powders, so as to meet lighting requirements or applications in high-color-rendering white light LEDs in the backlight, by complementation of luminescent colors.

Specific examples and comparative examples of a nitroxide fluorescent powder and method for preparing a same according to the present invention are further disclosed below, wherein the examples means that a nitroxide fluorescent powder product is obtained following a structure of a nitroxide fluorescent powder and method for preparing a same of the present invention, and the comparative examples means that a nitroxide fluorescent powder product is obtained following a nitroxide fluorescent powder and method for preparing a same disclosed in the prior art. The average oxygen atom content and the average nitrogen atom content in the fluorescent powders are obtained by an oxygen/nitrogen analyzer.

Example 1

Figure 2:
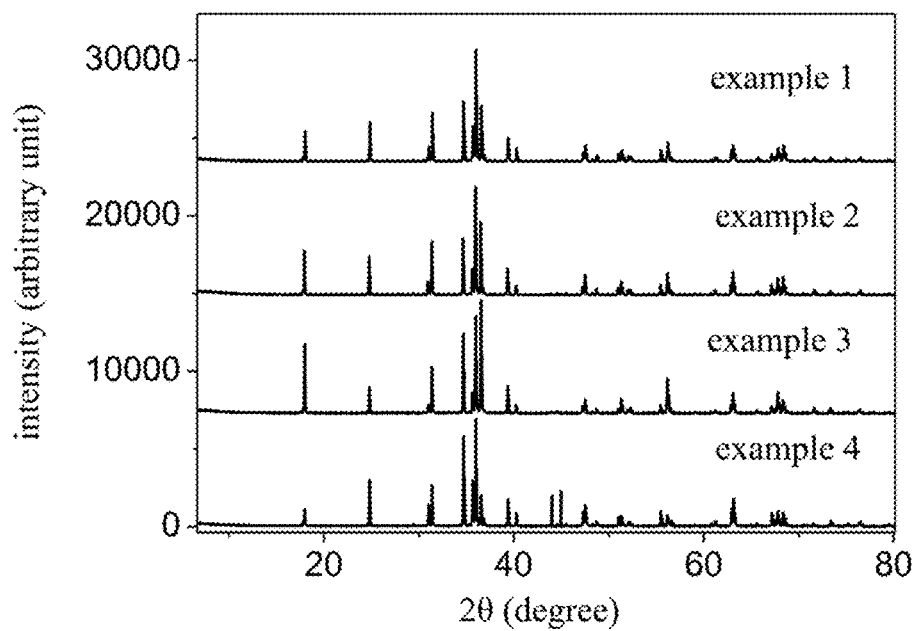
FIG. 2 is X-ray diffraction patterns of nitroxide fluorescent powder products in examples 1-4 of the present invention.

3.95 g of $Ca_3N_2$, 78.53 g of $Sr_3N_2$, 40.99 g of AlN, 46.76 g of $Si_3N_4$, and 3.52 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1780° C. under a hydrogen atmosphere for 12 h; and then the temperature was reduced to 450° C. at 10° C./min, and a mixture gas of nitrogen and oxygen of 90%:10% by volume was fed for calcination for 0.5 h; the resulting luminescent particle was pulverized and sieved, the sieved particle was placed into deionized water and stirred for 30 min, then suction-filtered, and finally washed to a conductivity of 8.56 μs/cm, to give a nitroxide fluorescent powder particle product. The X-ray diffraction pattern is shown in FIG. 2, the composition of the fluorescent powder crystal is $Sr_{0.9}Ca_{0.08}AlSiN_{2.84}O_{0.22}:Eu_{0.02}$, and as measured by auger electron spectroscopy coupled with ion etching, the surface layer zone of the crystal has a thickness of 30 nm, the transition zone of the crystal has a thickness of 50 nm, the oxygen atom content in the core of the inner core zone of the crystal is 3.3%, the oxygen atom content in the inner surface of the transition zone of the crystal is 4.2%, the oxygen atom content in the outer surface of the transition zone of the crystal is 22%, and the oxygen atom content in the outer surface of the surface layer zone of the crystal is 31%.

Example 2

43.98 g of $Ca_3N_2$, 7.76 g of $Sr_3N_2$, 40.99 g of AlN, 46.76 g of $Si_3N_4$, and 5.28 g of $Eu_2O_3$ were weighted. These starting materials were thoroughly mixed in a nitrogen atmosphere for 3 h and charged into an Mo crucible, which was rapidly transferred to a carbon tube furnace, and then the temperature was gradually raised to 2000° C. under a pure nitrogen atmosphere for 2 h; and then the temperature was reduced to 300° C. at 8° C./min, and a mixture gas of nitrogen and oxygen of 80%:20% by volume was fed for calcination for 24 h; the resulting fluorescent powder particle was pulverized and sieved, the sieved particle was placed into deionized water and stirred for 30 min, then suction-filtered, and finally washed to a conductivity of 8.89 μs/cm, to give a nitroxide fluorescent powder particle product. The X-ray diffraction pattern is shown in FIG. 2, the composition of the fluorescent powder is $Sr_{0.08}Ca_{0.89}AlSiN_{2.92}O_{0.12}:Eu_{0.03}$, and as measured by auger electron spectroscopy coupled with ion etching, the surface layer zone of the crystal has a thickness of 99 nm, the transition zone of the crystal has a thickness of 198 nm, the oxygen atom content in the core of the inner core zone of the crystal is 1.6%, the oxygen atom content in the inner surface of the transition zone of the crystal is 2%, the oxygen atom content in the outer surface of the transition zone of the crystal is 30%, and the oxygen atom content in the outer surface of the surface layer zone of the crystal is 49%.

Example 3

46.95 g of $Ca_3N_2$, 40.99 g of AlN, 46.76 g of $Si_3N_4$, and 8.8 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1600° C. under a CO atmosphere for 20 h; and then the temperature was reduced to 320° C. at 10° C./min, and a mixture gas of nitrogen and oxygen of 95%:5% by volume was fed for calcination for 1 h; the sieved fluorescent powder particle was placed into deionized water and stirred for 30 min, then suction-filtered, and finally washed to a conductivity of 9.52 µs/cm, to give a nitroxide fluorescent powder particle product. The X-ray diffraction pattern is shown in FIG. 2, the composition of the fluorescent powder crystal is $Ca_{0.95}AlSiN_{2.84}O_{0.24}:Eu_{0.05}$, and as measured by auger electron spectroscopy coupled with ion etching, the surface layer zone of the crystal has a thickness of 9 nm, the transition zone of the crystal has a thickness of 30 nm, the oxygen atom content in the core of the inner core zone of the crystal is 2.8%, the oxygen atom content in the inner surface of the transition zone of the crystal is 3.6%, the oxygen atom content in the outer surface of the transition zone of the crystal is 22%, and the oxygen atom content in the outer surface of the surface layer zone of the crystal is 30%.

Example 4

9.39 g of $Ca_3N_2$, 77.57 g of $Sr_3N_2$, 40.99 g of AlN, 46.76 g of $Si_3N_4$, and 1.76 g of $Eu_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1870° C. under a pure nitrogen atmosphere for 10 h; and then the temperature was reduced to 400° C. at 7° C./min, and a mixture gas of nitrogen and oxygen of 96%:4% by volume was fed for calcination for 3 h; the resulting fluorescent powder particle was pulverized and sieved, the sieved fluorescent powder particle was placed into deionized water and stirred for 30 min, then suction-filtered, and finally washed to a conductivity of 9.45 µs/cm, to give a nitroxide fluorescent powder particle product. The X-ray diffraction pattern is shown in FIG. 2, the composition of the fluorescent powder crystal is $Sr_{0.8}Ca_{0.19}AlSiN_{2.86}O_{0.21}:Eu_{0.01}$, and as measured by auger electron spectroscopy coupled with ion etching, the surface layer zone of the crystal has a thickness of 35 nm, the transition zone of the crystal has a thickness of 70 nm, the oxygen atom content in the core of the inner core zone of the crystal is 2.5%, the oxygen atom content in the inner surface of the transition zone of the crystal is 3.5%, the oxygen atom content in the outer surface of the transition zone of the crystal is 30%, and the oxygen atom content in the outer surface of the surface layer zone of the crystal is 35%.

Comparative Example 1

3.95 g of $Ca_3N_2$, 87.26 g of $Sr_3N_2$, 40.99 g of AlN, 46.76 g of $Si_3N_4$, and 3.52 g of $Eu_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1800° C. under a pure nitrogen atmosphere for 12 h; the resulting fluorescent powder particle was pulverized and sieved, the sieved fluorescent powder particle was placed into deionized water and stirred for 30 min, then suction-filtered, and finally washed to a conductivity of 7.12 µs/cm, to give a fluorescent powder particle product. The composition of the fluorescent powder is $Sr_{0.9}Ca_{0.08}AlSiN_3:Eu_{0.02}$.

The fluorescent powder particles in the examples and the comparative example as described above were made into a luminescent device respectively, and the testing results show that the luminescent intensity and the aging properties of the comparative example 1 are lower than those of the examples 1-4, as shown in Table 1. The aging conditions are: SMD 2835 LED Lamp Bead, chip size 10×30 mil, chip band 452.5-455 nm, current 150 mA, power 0.5 W, ambient conditions: normal temperature and moisture.

TABLE 1

| | luminescent intensity | 1000 h aging | | |
| --- | --- | --- | --- | --- |
| | | light decay | ΔX | ΔY |
| Example 1 | 103 | 2.7% | −0.008 | 0.009 |
| Example 2 | 104 | 2.05% | −0.005 | 0.005 |
| Example 3 | 102 | 3.2% | −0.009 | 0.010 |
| Example 4 | 101 | 2.5% | −0.06 | 0.008 |
| Comparative example 1 | 100 | 5.6% | −0.028 | 0.017 |

Example 5

Figure 3:
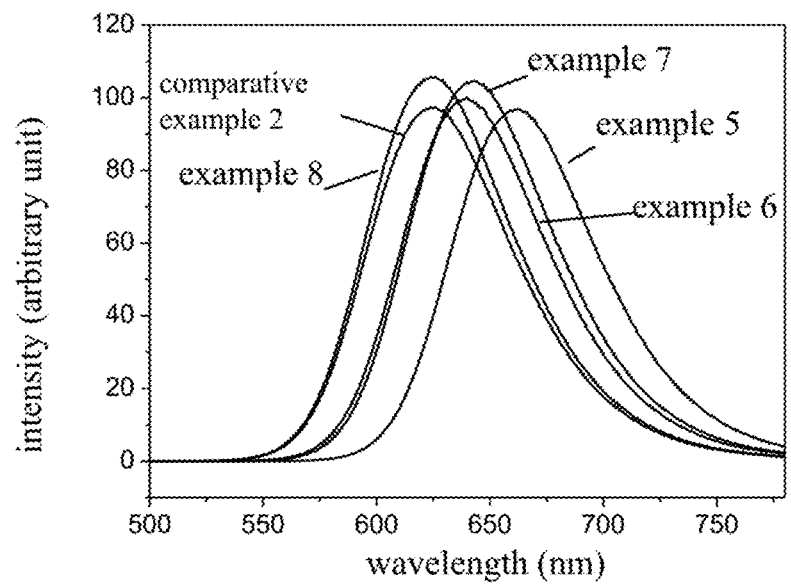
FIG. 3 is emission spectra of nitroxide fluorescent powder products in examples 5-8 of the present invention and a comparative example 2.
Figure 4:
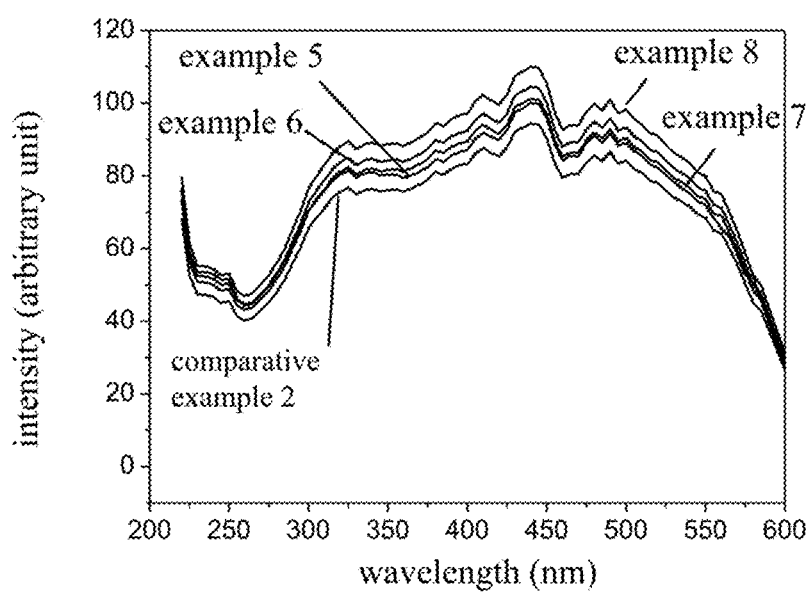
FIG. 4 is excitation spectra of the nitroxide fluorescent powder products in the examples 5-8 of the present invention and the comparative example 2.
Figure 5:
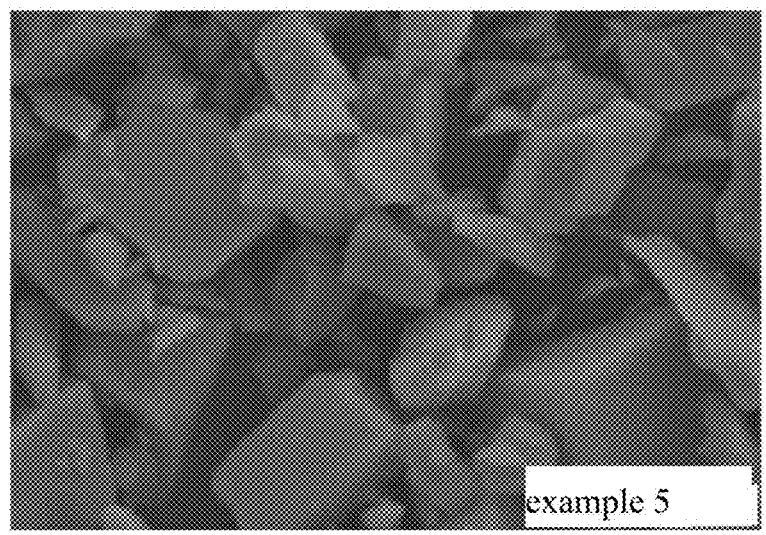
FIG. 5 is an SEM picture of the nitroxide fluorescent powder product in the example 5 of the present invention.

12.85 g of $Ca_3N_2$, 67.87 g of $Sr_3N_2$, 36.89 g of AlN, 42.08 g of $Si_3N_4$, 1.76 g of $Eu_2O_3$, 1.48 g of $Li_2CO_3$, 11.17 g of $GaN_3$, and 27.4 g of $Ge_3N_4$ were weighted. These starting materials were thoroughly mixed in a nitrogen atmosphere for 3 h and charged into an Mo crucible, which was rapidly transferred to a carbon tube furnace, and then the temperature was gradually raised to 1690° C. under a pure nitrogen atmosphere for 19 h; and then the temperature was reduced to 200° C. at 6° C./min, and a mixture gas of nitrogen and oxygen of 97%:3% by volume was fed for calcination for 15 h; the resulting fluorescent powder particle was pulverized and sieved, the sieved fluorescent powder particle was placed into deionized water and stirred for 30 min, then suction-filtered, and finally washed to a conductivity of 9.5 µs/cm, to give a nitroxide fluorescent powder particle product. The emission spectrum is shown in FIG. 3, the excitation spectrum is shown in FIG. 4, the SEM picture is shown in FIG. 5, the composition of the fluorescent powder crystal is $Li_{0.06}Sr_{0.08}Ca_{0.89}Al_{0.9}Ga_{0.1}Si_{0.9}Ge_{0.1}N_{2.88}O_{0.15}:Eu_{0.01}$, and as measured by auger electron spectroscopy coupled with ion etching, the surface layer zone of the crystal has a thickness of 15 nm, the transition zone of the crystal has a thickness of 42 nm, the oxygen atom content in the core of the inner core zone of the crystal is 1.8%, the oxygen atom content in the inner surface of the transition zone of the crystal is 2%, the oxygen atom content in the outer surface of the transition zone of the crystal is 37%, and the oxygen atom content in the outer surface of the surface layer zone of the crystal is 42%.

Example 6

Figure 6:
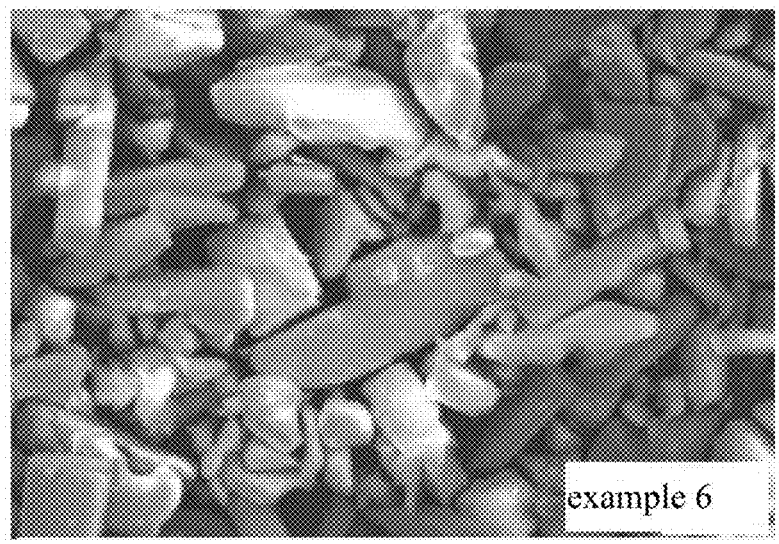
FIG. 6 is an SEM picture of the nitroxide fluorescent powder product in the example 6 of the present invention.

24.71 g of $Ca_3N_2$, 38.78 g of $Sr_3N_2$, 40.998 g of AlN, 46.76 g of $Si_3N_4$, 8.8 g of $Eu_2O_3$, and 7.66 g of BaO were weighted. These starting materials were thoroughly mixed in a nitrogen atmosphere for 3 h and charged into an Mo crucible, which was rapidly transferred to a carbon tube furnace, and then the temperature was gradually raised to 1790° C. under a nitrogen atmosphere for 18 h; and then the temperature was reduced to 300° C. at 7° C./min, and air was fed for calcination for 6 h; the resulting fluorescent powder particle was pulverized and sieved, the sieved fluorescent powder particle was placed into deionized water and stirred for 30 min, then suction-filtered, and finally washed to a conductivity of 7.5 μs/cm, to give a nitroxide fluorescent powder particle product. The emission spectrum is shown in FIG. 3, the excitation spectrum is shown in FIG. 4, the SEM picture is shown in FIG. 6, the composition of the fluorescent powder crystal is $Ba_{0.05}Sr_{0.4}Ca_{0.5}AlSiN_{2.76}O_{0.24}$:$Eu_{0.05}$, and as measured by auger electron spectroscopy coupled with ion etching, the surface layer zone of the crystal has a thickness of 25 nm, the transition zone of the crystal has a thickness of 45 nm, the oxygen atom content in the core of the inner core zone of the crystal is 3.2%, the oxygen atom content in the inner surface of the transition zone of the crystal is 3.9%, the oxygen atom content in the outer surface of the transition zone of the crystal is 29%, and the oxygen atom content in the outer surface of the surface layer zone of the crystal is 33%.

Example 7

Figure 7:
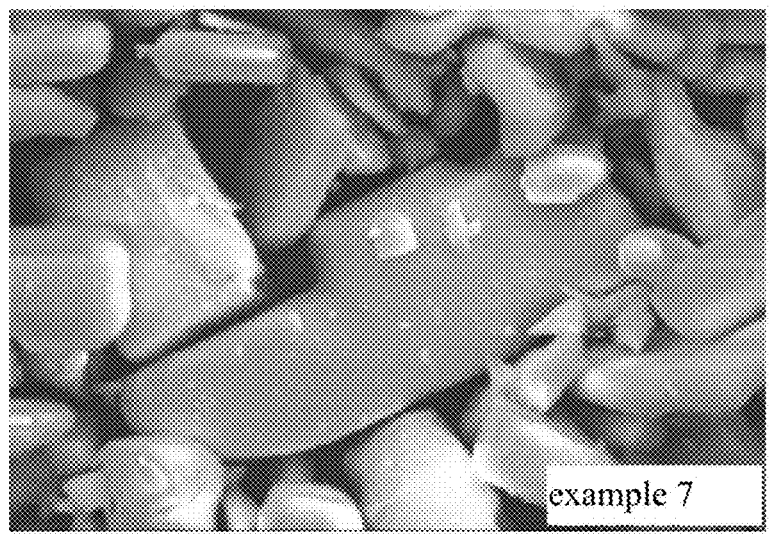
FIG. 7 is an SEM picture of the nitroxide fluorescent powder product in the example 7 of the present invention.

9.88 g of $Ca_3N_2$, 58.18 g of $Sr_3N_2$, 32.8 g of AlN, 37.4 g of $Si_3N_4$, 3.52 g of $Eu_2O_3$, 7.25 g of MgO, 31.37 g of $InN_3$, and 82.43 g $Sn_3N_4$ were weighted. These starting materials were thoroughly mixed in a nitrogen atmosphere for 3 h and charged into an Mo crucible, which was rapidly transferred to a carbon tube furnace, and then the temperature was gradually raised to 1780° C. under a pure nitrogen atmosphere for 15 h; and the resulting fluorescent powder particle was pulverized and sieved, the sieved fluorescent powder particle was placed into deionized water and stirred for 30 min, then suction-filtered, and finally washed to a conductivity of 6.9 μs/cm; and then it was placed in an oven at 450° C. for calcination for 0.5 h, and after sieving, a nitroxide fluorescent powder particle product was obtained. The emission spectrum is shown in FIG. 3, the excitation spectrum is shown in FIG. 4, the SEM picture is shown in FIG. 7, the composition of the fluorescent powder crystal is $Mg_{0.2}Sr_{0.6}Ca_{0.18}Al_{0.8}In_{0.2}Si_{0.8}Sn_{0.2}N_{2.76}O_{0.18}$:$Eu_{0.02}$, and as measured by auger electron spectroscopy coupled with ion etching, the surface layer zone of the crystal has a thickness of 23 nm, the transition zone of the crystal has a thickness of 72 nm, the oxygen atom content in the core of the inner core zone of the crystal is 2.6%, the oxygen atom content in the inner surface of the transition zone of the crystal is 3.5%, the oxygen atom content in the outer surface of the transition zone of the crystal is 38%, and the oxygen atom content in the outer surface of the surface layer zone of the crystal is 41%.

Example 8

Figure 8:
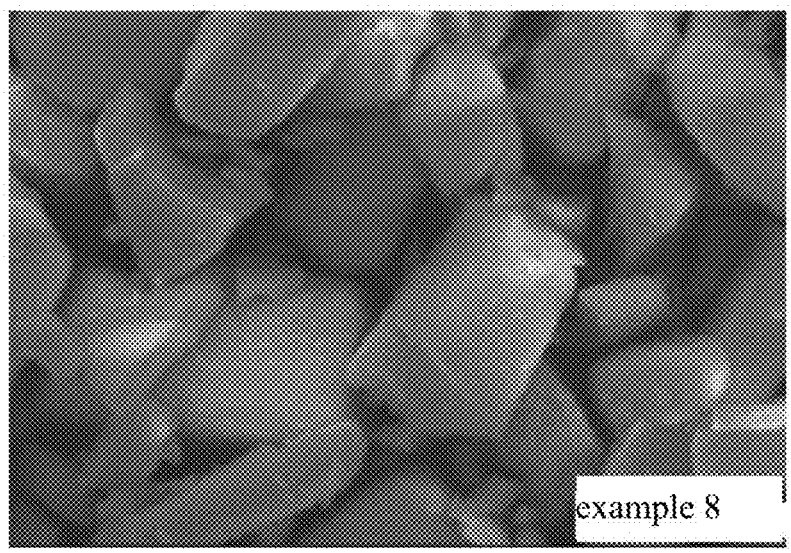
FIG. 8 is an SEM picture of the nitroxide fluorescent powder product in the example 8 of the present invention.

2.22 g of $Ca_3N_2$, 89.2 g of $Sr_3N_2$, 40.998 g of AlN, 46.76 g of $Si_3N_4$, 3.52 g of $Eu_2O_3$, and 3.73 g of $Dy_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1750° C. under a nitrogen atmosphere for 10 h; and the resulting fluorescent powder particle was pulverized and sieved, the sieved nitroxide fluorescent powder particle was placed into deionized water and stirred for 30 min, then suction-filtered, and finally washed to a conductivity of 9.8 μs/cm; and then it was placed in an oven at 280° C. for calcination for 18 h, and after sieving, a nitroxide fluorescent powder particle product was obtained. The emission spectrum is shown in FIG. 3, the excitation spectrum is shown in FIG. 4, the SEM picture is shown in FIG. 8, the structural formula of the fluorescent powder crystal is $Dy_{0.01}Sr_{0.92}Ca_{0.45}AlSiN_{2.85}O_{0.21}$:$Eu_{0.02}$, and as measured by auger electron spectroscopy coupled with ion etching, the surface layer zone of the crystal has a thickness of 87 nm, the transition zone of the crystal has a thickness of 14 nm, the oxygen atom content in the core of the inner core zone of the crystal is 2.5%, the oxygen atom content in the inner surface of the transition zone of the crystal is 3.6%, the oxygen atom content in the outer surface of the transition zone of the crystal is 36%, and the oxygen atom content in the outer surface of the surface layer zone of the crystal is 45%.

Comparative Example 2

2.22 g of $Ca_3N_2$, 89.2 g of $Sr_3N_2$, 40.998 g of AlN, 46.76 g of $Si_3N_4$, 3.52 g of $Eu_2O_3$, and 3.73 g of $Dy_2O_3$ were weighted. These starting materials were thoroughly mixed in a nitrogen atmosphere for 3 h and charged into an Mo crucible, which was rapidly transferred to a tubular furnace, and then the temperature was gradually raised to 1750° C. under a pure nitrogen atmosphere for 15 h; the resulting fluorescent powder particle was pulverized and sieved, the sieved fluorescent powder particle was placed into deionized water and stirred for 30 min, then suction-filtered, and finally washed to a conductivity of 8.12 μs/cm, to give a fluorescent powder particle product. The emission spectrum is shown in FIG. 3, the excitation spectrum is shown in FIG. 4, and the composition of the fluorescent powder is $Sr_{0.92}Ca_{0.045}AlSiN_3$:$Eu_{0.02}Dy_{0.01}$.

The fluorescent powder particles in the examples and the comparative example as described above were made into a luminescent device respectively, and the testing results show that the luminescent intensity and the aging properties of the comparative example 2 are lower than those of the examples 5-8, as shown in Table 2. The aging conditions are: SMD 2835 LED Lamp Bead, chip size 10×30 mil, chip band 452.5-455 nm, current 150 mA, power 0.5 W, ambient conditions: normal temperature and moisture.

TABLE 2

| | luminescent intensity | 1000 h aging | | |
|---|---|---|---|---|
| | | light decay | ΔX | ΔY |
| Example 5 | 101 | 3.0% | −0.0010 | 0.0010 |
| Example 6 | 102 | 2.9% | −0.007 | 0.009 |
| Example 7 | 100.3 | 2.7% | −0.006 | 0.008 |
| Example 8 | 102 | 2.4% | −0.06 | 0.008 |
| Comparative example 2 | 100 | 6.3% | −0.038 | 0.027 |

Example 9

Figure 9:
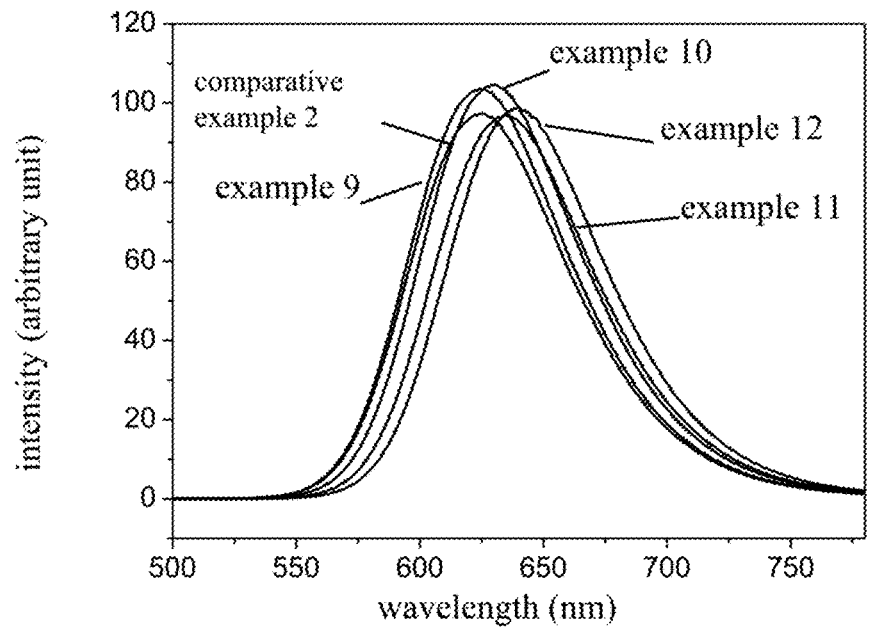
FIG. 9 is emission spectra of nitroxide fluorescent powder products in examples 9-12 of the present invention and the comparative example 2.

7.1 g of $Ba_3N_2$, 2.47 g of $Ca_3N_2$, 77.56 g of $Sr_3N_2$, 2.015 g of MgO, 49.19 g of AlN, 37.41 g of $Si_3N_4$, 3.52 g of $Eu_2O_3$, 1.99 g of $Lu_2O_3$, and 1.89 g of $Ho_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1870° C. under a pure nitrogen atmosphere for 10 h; and the resulting fluorescent powder particle was pulverized and sieved, the sieved fluorescent powder particle was placed into deionized water and stirred for 30 min, then suction-filtered, and finally washed to a conductivity of 9.8 μs/cm; and then it was placed in an oven at 300° C. for calcination for 12 h, and after sieving, a nitroxide fluorescent powder particle product was obtained. The emission spectrum is shown in FIG. 9, the composition of the fluorescent powder crystal is $Sr_{0.8}Ca_{0.005}Ba_{0.05}Mg_{0.05}Al_{1.2}Si_{0.8}N_{2.71}O_{0.33}$:$Eu_{0.02}Lu_{0.01}Ho_{0.01}$, and as measured by auger electron spectroscopy coupled with ion etching, the surface layer zone of the crystal has a thickness of 56 nm, the transition zone of the crystal has a thickness of 24 nm, the oxygen atom content in the core of the inner core zone of the crystal is 4%, the oxygen atom content in the inner surface of the transition zone of the crystal is 5.6%, the oxygen atom content in the outer surface of the transition zone of the crystal is 33%, and the oxygen atom content in the outer surface of the surface layer zone of the crystal is 39%.

Example 10

4.45 g of $Ca_3N_2$, 67.87 g of $Sr_3N_2$, 0.37 g of $Li_2CO_3$, 32.79 g of AlN, 56.11 g of $Si_3N_4$, 15.84 g of $Eu_2O_3$, and 1.81 g of $Gd_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1780° C. under a pure nitrogen atmosphere for 8 h; and the resulting fluorescent powder particle was pulverized and sieved, the sieved fluorescent powder particle was placed into deionized water and stirred for 30 min, then suction-filtered, and finally washed to a conductivity of 5.7 μs/cm; and then it was placed in an oven at 350° C. for calcination for 2 h, and after sieving, a nitroxide fluorescent powder particle product was obtained. The emission spectrum is shown in FIG. 9, the composition of the fluorescent powder is $Li_{0.01}Ca_{0.09}Sr_{0.7}Al_{0.8}Si_{1.2}N_{2.68}O_{0.48}$:$Eu_{0.09}Gd_{0.01}$, and as measured by auger electron spectroscopy coupled with ion etching, the surface layer zone of the crystal has a thickness of 34 nm, the transition zone of the crystal has a thickness of 14 nm, the oxygen atom content in the core of the inner core zone of the crystal is 6.5%, the oxygen atom content in the inner surface of the transition zone of the crystal is 8.2%, the oxygen atom content in the outer surface of the transition zone of the crystal is 25%, and the oxygen atom content in the outer surface of the surface layer zone of the crystal is 35%.

Example 11

32.12 g of $Ca_3N_2$, 38.78 g of $Sr_3N_2$, 0.69 g of $K_2CO_3$, 45.09 g of AlN, 42.08 g of $Si_3N_4$, 5.28 g of $Eu_2O_3$, and 1.54 g of CeN were weighted. These starting materials were thoroughly mixed in a nitrogen atmosphere for 3 h and charged into an Mo crucible, which was rapidly transferred to a carbon tube furnace, and then the temperature was gradually raised to 1680° C. under a pure nitrogen atmosphere for 19 h; and the resulting fluorescent powder particle was pulverized and sieved, the sieved fluorescent powder particle was placed into deionized water and stirred for 30 min, then suction-filtered, and finally washed to a conductivity of 6.9 μs/cm; and then it was placed in an oven at 400° C. for calcination for 13 h, and after sieving, a nitroxide fluorescent powder particle product was obtained. The emission spectrum is shown in FIG. 9, the composition of the fluorescent powder is $K_{0.01}Ca_{0.65}Sr_{0.4}Al_{0.9}Si_{1.1}N_{2.85}O_{0.27}$:$Eu_{0.03}Ce_{0.01}$, and as measured by auger electron spectroscopy coupled with ion etching, the surface layer zone of the crystal has a thickness of 102 nm, the transition zone of the crystal has a thickness of 56 nm, the oxygen atom content in the core of the inner core zone of the crystal is 3.7%, the oxygen atom content in the inner surface of the transition zone of the crystal is 4.8%, the oxygen atom content in the outer surface of the transition zone of the crystal is 37%, and the oxygen atom content in the outer surface of the surface layer zone of the crystal is 42%.

Example 12

32.12 g of $Ca_3N_2$, 38.78 g of $Sr_3N_2$, 0.69 g of $K_2CO_3$, 36.89 g of AlN, 2.48 g of BN, 83.73 g of GaN, 42.08 g of $Si_3N_4$, 5.28 g of $Eu_2O_3$, and 1.54 g of CeN were weighted. These starting materials were thoroughly mixed in a nitrogen atmosphere for 3 h and charged into an Mo crucible, which was rapidly transferred to a carbon tube furnace, and then the temperature was gradually raised to 1600° C. under a pure nitrogen atmosphere for 20 h; and the resulting fluorescent powder particle was pulverized and sieved, the sieved fluorescent powder particle was placed into deionized water and stirred for 30 min, then suction-filtered, and finally washed to a conductivity of 6.9 μs/cm; and then it was placed in an oven at 200° C. for calcination for 24 h, and after sieving, a nitroxide fluorescent powder particle product was obtained. The emission spectrum is shown in FIG. 9, the composition of the fluorescent powder is $K_{0.01}Ca_{0.65}Sr_{0.4}Al_{0.9}B_{0.1}Ga_{0.1}Si_{0.9}N_{2.85}O_{0.27}$:$Eu_{0.03}Ce_{0.01}$, and as measured by auger electron spectroscopy coupled with ion etching, the surface layer zone of the crystal has a thickness of 67 nm, the transition zone of the crystal has a thickness of 56 nm, the oxygen atom content in the core of the inner core zone of the crystal is 3.6%, the oxygen atom content in the inner surface of the transition zone of the crystal is 4.2%, the oxygen atom content in the outer surface of the transition zone of the crystal is 37%, and the oxygen atom content in the outer surface of the surface layer zone of the crystal is 42%.

Example 13

Figure 10:
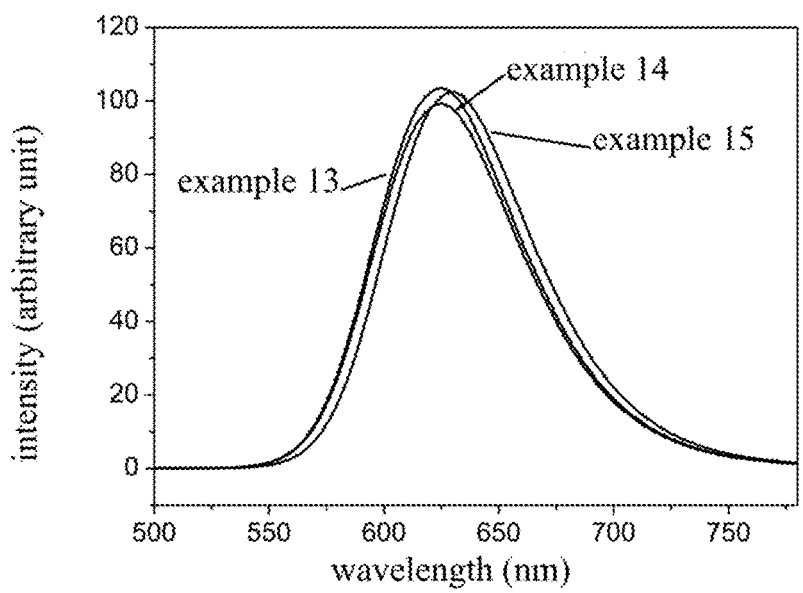
FIG. 10 is emission spectra of nitroxide fluorescent powder products in examples 13-15 of the present invention.

5.44 g of $Ca_3N_2$, 82.41 g of $Sr_3N_2$, 36.89 g of AlN, 9.13 g of $Ge_3N_4$, 13.74 g of $Sn_3N_4$, 42.08 g of $Si_3N_4$, and 7.04 g of $Eu_2O_3$ were weighted. These starting materials were thoroughly mixed in a nitrogen atmosphere for 3 h and charged into an Mo crucible, which was rapidly transferred to a carbon tube furnace, and then the temperature was gradually raised to 1680° C. under a pure nitrogen atmosphere for 19 h; and the resulting fluorescent powder particle was pulverized and sieved, the sieved fluorescent powder particle was placed into deionized water and stirred for 30 min, then suction-filtered, and finally washed to a conductivity of 6.9 μs/cm; and then it was placed in an oven at 380° C. for calcination for 10 h, and after sieving, a nitroxide fluorescent powder particle product was obtained. The emission spectrum is shown in FIG. 10, the composition of the fluorescent powder is $Ca_{0.11}Sr_{0.85}Al_{0.9}Ge_{0.1}Sn_{0.1}Si_{0.9}N_{2.57}O_{0.3}$:$Eu_{0.04}$, and as measured by auger electron spectroscopy coupled with ion etching, the surface layer zone of the crystal has a thickness of 87 nm, the transition zone of the crystal has a thickness of 102 nm, the oxygen atom content in the core of the inner core zone of the crystal is 4.2%, the oxygen atom content in the inner surface of the transition zone of the crystal is 5.2%, the oxygen atom content in the outer surface of the transition zone of the crystal is 35%, and the oxygen atom content in the outer surface of the surface layer zone of the crystal is 44%.

Example 14

4.89 g of $Ca_3N_2$, 95.99 g of $Sr_3N_2$, 47.5 g of AlN, 56.1 g of $Si_3N_4$, and 0.17 g of EuN were weighted. These starting materials were thoroughly mixed in a nitrogen atmosphere for 3 h and charged into an Mo crucible, which was rapidly transferred to a carbon tube furnace, and then the temperature was gradually raised to 1730° C. under a pure nitrogen atmosphere for 19 h; and the resulting fluorescent powder particle was pulverized and sieved, the sieved fluorescent powder particle was placed into deionized water and stirred for 30 min, then suction-filtered, and finally washed to a conductivity of 8.5 μs/cm; and then it was placed in an oven at 250° C. for calcination for 2 h, and after sieving, a nitroxide fluorescent powder particle product was obtained. The emission spectrum is shown in FIG. 10, the composition of the fluorescent powder is $Ca_{0.099}Sr_{0.99}Al_{1.16}Si_{1.2}N_{3.47}O_{0.03}:Eu_{0.001}$, and as measured by auger electron spectroscopy coupled with ion etching, the surface layer zone of the crystal has a thickness of 25 nm, the transition zone of the crystal has a thickness of 9 nm, the oxygen atom content in the core of the inner core zone of the crystal is 0.4%, the oxygen atom content in the inner surface of the transition zone of the crystal is 0.6%, the oxygen atom content in the outer surface of the transition zone of the crystal is 10%, and the oxygen atom content in the outer surface of the surface layer zone of the crystal is 14%.

Example 15

9.88 g of $Ca_3N_2$, 71.75 g of $Sr_3N_2$, 19.68 g of AlN, 20.39 g of $Al_2O_3$, 37.4 g of $Si_3N_4$, and 10.56 g of EuN were weighted. These starting materials were thoroughly mixed in a nitrogen atmosphere for 3 h and charged into an Mo crucible, which was rapidly transferred to a carbon tube furnace, and then the temperature was gradually raised to 1690° C. under a pure nitrogen atmosphere for 20 h; and the resulting fluorescent powder particle was pulverized and sieved, the sieved fluorescent powder particle was placed into deionized water and stirred for 30 min, then suction-filtered, and finally washed to a conductivity of 8.7 μs/cm; and then it was placed in an oven at 290° C. for calcination for 17 h, and after sieving, a nitroxide fluorescent powder particle product was obtained. The emission spectrum is shown in FIG. 10, the composition of the fluorescent powder is $Ca_{0.2}Sr_{0.74}Al_{0.8}Si_{0.8}N_{2.2}O_{0.5}:Eu_{0.06}$, and as measured by auger electron spectroscopy coupled with ion etching, the surface layer zone of the crystal has a thickness of 38 nm, the transition zone of the crystal has a thickness of 125 nm, the oxygen atom content in the core of the inner core zone of the crystal is 9%, the oxygen atom content in the inner surface of the transition zone of the crystal is 12.5%, the oxygen atom content in the outer surface of the transition zone of the crystal is 40%, and the oxygen atom content in the outer surface of the surface layer zone of the crystal is 48%.

The fluorescent powder particles in the examples and the comparative example 2 as described above were made into a luminescent device respectively, and the testing results show that the luminescent intensity and the aging properties of the comparative example 2 are lower than those of the examples 9-15, as shown in Table 3. The aging conditions are: SMD 2835 LED Lamp Bead, chip size 10×30 mil, chip band 452.5-455 nm, current 150 mA, power 0.5 W, ambient conditions: normal temperature and moisture.

TABLE 3

|  | luminescent intensity | 1000 h aging | | |
| --- | --- | --- | --- | --- |
|  |  | light decay | ΔX | ΔY |
| Example 9 | 100.1 | 2.5% | −0.008 | 0.009 |
| Example 10 | 100.5 | 3.2% | −0.0010 | 0.0011 |
| Example 11 | 100.2 | 2.4% | −0.005 | 0.006 |
| Example 12 | 102 | 2.3% | −0.06 | 0.007 |
| Example 13 | 101 | 2.5% | −0.06 | 0.008 |
| Example 14 | 101 | 3.1% | −0.05 | 0.008 |
| Example 15 | 102 | 2.2% | −0.04 | 0.006 |
| comparative example 2 | 100 | 6.3% | −0.038 | 0.027 |

The contents not specifically described in the specific embodiments of the present invention are known in the art and may be implemented with reference to known techniques.

The present invention has been verified via repeated tests, and satisfactory test results are achieved.

The specific embodiments and examples above are provided to support the technical concepts of a nitroxide fluorescent powder and method for preparing a same, a nitroxide illuminant, and a luminescent device of the present invention, and are not intended to limit the scope of protection of the present invention. Any equivalent modification or variations made based on the present technical solution following the technical concepts of the present invention, all fall within the scope of protection of the present invention.

What is claimed is:

1. A nitroxide fluorescent powder comprising an inorganic compound containing M, A, B, O, N, and R elements; in which the M element is at least one of Ca, Sr, Ba, Mg, Li, Na, and K, the A element is at least one of B, Al, Ga, and In, the B element is at least one of C, Si, Ge, and Sn, the O element is oxygen, the N element is nitrogen, the R element is at least one of Ce, Eu, Lu, Dy, Gd, and Ho, wherein the inorganic compound forms a crystal in a crystalline phase, and the oxygen atom content in the crystal in a crystalline phase is in an increasing structural distribution from a core to surface of the crystal.

2. The nitroxide fluorescent powder of claim 1, wherein the increasing structural distribution means that an inner core zone, a transition zone, and a crystal surface layer zone of the crystal in a crystalline phase are respectively formed depending on the distribution of the oxygen atom content in the crystal in a crystalline phase; the oxygen atom content in the inner core zone is in a gently increasing structural distribution from inside to outside, namely, the oxygen atom content in an outer surface of the inner core zone/the oxygen atom content in a core of the inner core zone ≤1.5; the oxygen atom content in the transition zone is in a dramatically increasing structural distribution from inside to outside, namely, the oxygen atom content in an outer surface of the transition zone/the oxygen atom content in an inner surface of the transition zone >1.5; the oxygen atom content in the surface layer zone is in a gently increasing structural distribution from inside to outside, namely, the oxygen atom content in an outer surface of the surface layer zone/the oxygen atom content in an inner surface of the surface layer zone ≤1.5.

3. The nitroxide fluorescent powder of claim 2, wherein the oxygen atom content in an outer surface of the transition zone/the oxygen atom content in an inner surface of the transition zone is >5.

4. The nitroxide fluorescent powder of claim 2, wherein in the crystal in a crystalline phase, the surface layer zone has a thickness of no more than 100 nm, the transition zone has a thickness of no more than 200 nm, and the inner core zone has a thickness from the inner surface of the transition zone to the core of the inner core zone.

5. The nitroxide fluorescent powder of claim 2, wherein the oxygen atom content in the core of the inner core zone is ≤10%; the oxygen atom content in the outer surface of the surface layer zone is 30%-50%.

6. The nitroxide fluorescent powder of claim 1, wherein the crystal in a crystalline phase formed by the inorganic compound has a chemical formula of Mm-rAaBbNnOc:Rr, in which $0.9 \leq m \leq 1.1$, $0.8 \leq a \leq 1.2$, $0.8 \leq b \leq 1.2$, $2.5 < n \leq 3.5$, $0.001 \leq c \leq 1$, $0.001 \leq r \leq 0.1$, and $2m+3a+4b-3n-2c=0$ is met.

7. The nitroxide fluorescent powder of claim 1, wherein in the inorganic compound, M is one or a combination of Sr and Ca, A is Al, B is Si, and R is Eu.

8. The nitroxide fluorescent powder of claim 1, wherein the inorganic compound has the same crystal structure as the crystalline phase of $CaAlSiN_3$.

9. The nitroxide fluorescent powder of claim 1, wherein the nitroxide fluorescent powder is excited at an excitation wavelength ranging from 300-500 nm to emit red light having a peak wavelength at 600-670 nm.

10. A nitroxide illuminant comprising a mixture of the nitroxide fluorescent powder of claim 1 and other crystalline grains or non-crystalline particles, the nitroxide fluorescent powder being present in the mixture at a proportion of no less than 50 wt %.

11. A method for preparing the nitroxide fluorescent powder of claim 1, wherein by comprising the following basic steps:
    step 1: weighting desired starting materials at a stoichiometric ratio of cations in the composition of a chemical formula $M_{m-r}A_aB_bO_cN_n:R_r$, with a nitride of M, a nitride of A, a nitride of B, and a nitride or oxide of R as starting materials, and uniformly mixing to form a mix;
    step 2: subjecting the mix obtained in the step 1 to high-temperature calcination in a calcination atmosphere, followed by low-temperature calcination at a reduced predetermined temperature in a nitrogen-oxygen mixture or air atmosphere, to give a nitroxide fluorescent powder semi-product; and
    step 3: subjecting the nitroxide fluorescent powder semi-product obtained in the step 2 to a post-treatment, to give a nitroxide fluorescent powder product.

12. A method for preparing the nitroxide fluorescent powder of claim 1, wherein by comprising the following basic steps:
    step 1: weighting desired starting materials at a stoichiometric ratio of cations in the composition of a chemical formula $M_{m-r}A_aB_bO_cN_n:R_r$, with a nitride of M, a nitride of A, a nitride of B, and a nitride or oxide of R as starting materials, and uniformly mixing to form a mix;
    step 2: subjecting the mix obtained in the step 1 to high-temperature calcination in a calcination atmosphere, to give a nitroxide fluorescent powder semi-product;
    step 3: subjecting the nitroxide fluorescent powder semi-product obtained in the step 2 to a post-treatment; and
    step 4: subjecting the nitroxide fluorescent powder semi-product obtained in the step 3 to low-temperature calcination in air, to give a nitroxide fluorescent powder product.

13. The method for preparing the nitroxide fluorescent powder of claim 11, characterized in that in the step 2, the high-temperature calcination has a temperature of 1600-2000° C. and a duration of 2-20 h, and the atmosphere of the high-temperature calcination is a pure nitrogen atmosphere or a reducing gas atmosphere; the low-temperature calcination has a temperature of 200-450° C. and a duration of 0.5-24 h, the volume percent of oxygen in the nitrogen-oxygen mixture atmosphere is no more than 20%.

14. The method for preparing the nitroxide fluorescent powder of claim 12, wherein in the step 2, the high-temperature calcination has a temperature of 1600-2000° C. and a duration of 2-20 h, and the atmosphere of the high-temperature calcination is a pure nitrogen atmosphere or a reducing gas atmosphere; in the step 4, the low-temperature calcination has a temperature of 200-450° C. and a duration of 0.5-24 h, and the atmosphere of the low-temperature calcination is an air atmosphere.

15. The method for preparing the nitroxide fluorescent powder of claim 11, wherein in the step 3, the post-treatment comprises primary grinding, screening, washing, drying, secondary grinding, and screening, and the washing is performed to obtain the nitroxide fluorescent powder having a conductivity of less than 10 μs/cm.

16. The method for preparing the nitroxide fluorescent powder of claim 12, wherein in the step 3, the post-treatment comprises primary grinding, screening, washing, drying, secondary grinding, and screening, and the washing is performed to obtain the nitroxide fluorescent powder having a conductivity of less than 10 μs/cm.

17. A luminescent device comprising an LED chip emitting UV light, violet light or blue light, and a fluorescent powder, wherein the fluorescent powder is a nitroxide fluorescent powder comprising an inorganic compound containing M, A, B, O, N, and R elements; in which the M element is at least one of Ca, Sr, Ba, Mg, Li, Na, and K, the A element is at least one of B, Al, Ga, and In, the B element is at least one of C, Si, Ge, and Sn, the O element is oxygen, the N element is nitrogen, the R element is at least one of Ce, Eu, Lu, Dy, Gd, and Ho, characterized in that the inorganic compound forms a crystal in a crystalline phase, and the oxygen atom content in the crystal in a crystalline phase is in an increasing structural distribution from a core to surface of the crystal.

* * * * *